US009906220B1

(12) United States Patent
Frank et al.

(10) Patent No.: US 9,906,220 B1
(45) Date of Patent: Feb. 27, 2018

(54) TAILORED SWITCHING OF POWER TRANSISTORS

(71) Applicant: Infineon Technologies Austria AG, Villach (AT)

(72) Inventors: Wolfgang Frank, Augsburg (DE); Remigiusz Viktor Boguszewicz, Essen (DE)

(73) Assignee: INFINEON TECHNOLOGIES AUSTRIA AG, Villach (AT)

( * ) Notice: Subject to any disclaimer, the term of this patent is extended or adjusted under 35 U.S.C. 154(b) by 0 days.

(21) Appl. No.: 15/251,692

(22) Filed: Aug. 30, 2016

(51) Int. Cl.
*H03K 17/567* (2006.01)
*H03K 17/687* (2006.01)

(52) U.S. Cl.
CPC ......... *H03K 17/567* (2013.01); *H03K 17/687* (2013.01)

(58) Field of Classification Search
CPC .. H03K 5/04; H03K 5/08; H03K 5/12; H03K 5/24; H03K 7/08; H03K 17/687; H03K 17/689
USPC ......................... 327/108, 109, 110, 111, 112
See application file for complete search history.

(56) References Cited

U.S. PATENT DOCUMENTS

| | | | | |
|---|---|---|---|---|
| 7,973,564 | B1 * | 7/2011 | Chuang | H03K 17/04123 326/86 |
| 2004/0160258 | A1 * | 8/2004 | Tobita | G09G 3/3688 327/333 |
| 2010/0271079 | A1 * | 10/2010 | Choi | H03K 17/063 327/108 |

OTHER PUBLICATIONS

K. Fink, Untersuchung Neuartiger Konzepte zur geregelten Ansteuerung von IGBTs; TU Berlin Dissertation, Apr. 26, 2010, English Abstract p. 6, 226 pages.

Lobsiger et al., "Closed-Loop IGBT Gate Drive Featuring Highly Dymanic DL/DT and DV/DT Control," Proceedings of the IEEE Energy Conversion Congress and Exposition (ECCE USA 2012), Raleigh, USA, Sep. 16-20, 2012, 9 pages.

* cited by examiner

*Primary Examiner* — John Poos
(74) *Attorney, Agent, or Firm* — Slater Matsil, LLP

(57) ABSTRACT

A circuit comprises an input terminal configured to receive an input signal. A high-side driver is configured to provide a high-side control signal to a high-side power transistor via a high-side terminal based on the input signal. A low-side driver is configured to provide a low-side control signal to a low-side power transistor based on the input signal. An interface is configured to couple the high-side terminal and the low-side terminal via a capacitor.

21 Claims, 5 Drawing Sheets

TAILORED SWITCHING OF POWER TRANSISTORS

TECHNICAL FIELD

Various embodiments relate to the circuit including a high-side driver configured to provide a high-side control signal to a high-side power transistor via a high-side terminal based on an input signal, a low-side driver configured to provide a low-side control signal to a low-side power transistor via a low-side terminal based on the input signal, and an interface configured to couple the high-side terminal and the low-side terminal via a capacitor.

BACKGROUND

Solid-state power transistors are used for various applications, e.g., switching load currents provided to the engine of an electrical vehicle. Sometimes, a switching duration of the power transistors is too short given the requirements of the particular application. For example, if the power transistors are used to switch load currents provided to the engine of an electrical vehicle, damage to the engine can result from a short switching duration. For example, fast switching of the drive currents provided to the engine of an electrical vehicle can result in increased wear out of the primary windings of the respective actuator and/or damage to the bearing of the rotor.

In some examples, the switching duration of power transistors can be tailored by employing control resistors that modify a control signal provided to a control contact of the respective power transistor. However, it has been found that tailoring of the switching duration by appropriately dimensioning the resistivity of the control resistors is only possible within a comparably limited range.

Further, typically, the resistivity of the control resistors is dimensioned with respect to the operating range at which the power transistor has the shortest switching duration. Typically, this operating range corresponds to small load currents switched by the power transistor and low temperatures. Once the resistivity of the control resistors has been set, the resistivity is fixed and cannot be easily altered. This may result in a reduced switching duration in different operating range; different operating ranges can be encountered, e.g., with increased aging or changing temperature. Then, a higher power loss results.

All this results in a tedious task of dimensioning the resistivity of the control resistors. The dimensioning is error-prone.

SUMMARY

Therefore, a need exists for advanced techniques of providing control signals to power transistors. In particular, a need exists for respective circuits and methods which overcome or mitigate at least some of the above-identified problem.

This need is met by the features of the independent claims. The features of the dependent claims define embodiments.

In an example, a circuit includes an input terminal. The input terminal is configured to receive an input signal. The circuit further includes a high-side driver. The high-side driver is configured to provide a high-side control signal to a high-side power transistor via a high-side terminal based on the input signal. The circuit further includes a low-side driver. The low-side drive is configured to provide a no-site control signal to a low-side power transistor via a low-side terminal based on the input signal. The circuit further includes an interface configured to couple the high-side terminal and the low-side terminal via a capacitor.

In an example, a method includes receiving an input signal and providing a high-side control signal to a high-side power transistor based on the input signal. The method further includes providing a low-side control signal to a low-side power transistor based on the input signal. The method further includes coupling the high-side terminal and the low-side terminal via a capacitor.

In an example, a circuit includes an input terminal. The input terminal is configured to receive an input signal. The circuit further includes a high-side driver. The high-side driver is configured to provide a high-side control signal to a high-side power transistor via a high-side terminal based on the input signal. The circuit further includes an interface configured to couple, via a capacitor, the high-side terminal with a low-side terminal which can provide a low-side control signal to a low-side power transistor from a low-side driver.

In an example, a circuit includes an input terminal. The input terminal is configured to receive an input signal. The circuit further includes a low-side driver. The low-side driver is configured to provide a low-side control signal to a low-side power transistor via a low-side terminal based on the input signal. The circuit further includes an interface configured to couple, via a capacitor, the low-side terminal with a high-side terminal which can provide a high-side control signal to a high-side power transistor from a high-side driver.

It is to be understood that the features mentioned above and those yet to be explained below may be used not only in the respective combinations indicated, but also in other combinations or in isolation without departing from the scope of the invention.

DETAILED DESCRIPTION OF ILLUSTRATIVE EMBODIMENTS

Figure 1:
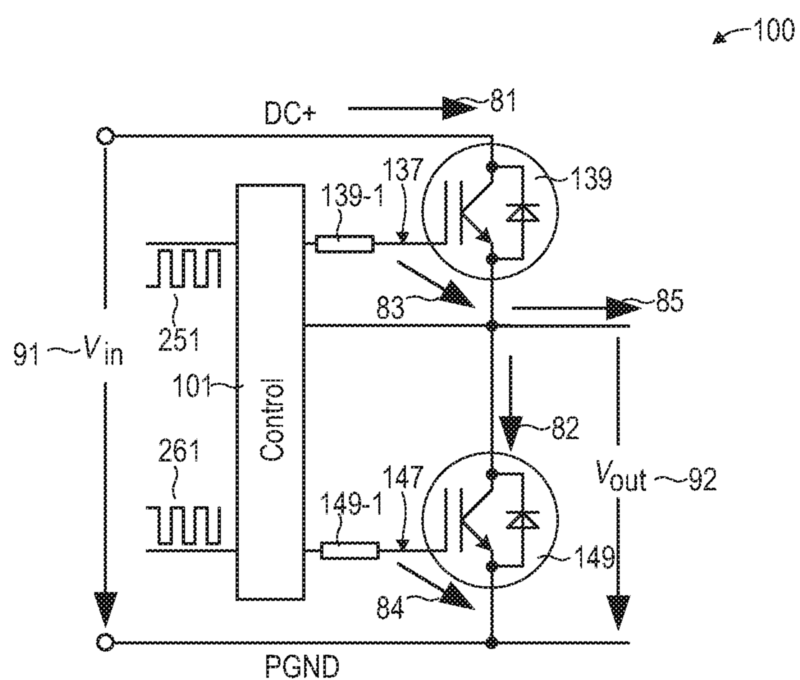
FIG. 1 is a circuit diagram of a system including a half bridge drive circuit, a high-side control resistor, a high-side power transistor, a low-side control resistors, and a low-side power transistor according to various embodiments.

In the following, embodiments of the invention will be described in detail with reference to the accompanying drawings. It is to be understood that the following description of embodiments is not to be taken in a limiting sense. The scope of the invention is not intended to be limited by the embodiments described hereinafter or by the drawings, which are taken to be illustrative only.

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Hereinafter, techniques of providing control signals to power transistors are described. The power transistors may be configured to switch drive currents having an amplitude of more than 50 A, preferably of more than 100 A. the power transistors may be implemented as solid-state devices such as semiconductor devices. The power transistors may be implemented as bipolar transistors or field effect transistors (FETs). Examples include insulated-gate bipolar transistors (IGBTs). The transistors typically have a control contact to receive the control signal. For FETs and IGBTs, the control contact is often labelled gate; for bipolar transistors the control contact is often labelled base. The transistors typically have two load contacts; the load current between the load contacts can be controlled in magnitude and ultimately switched by the control signal. For FETs the load contacts are typically labelled source and drain; for bipolar transistors and IGBTs, the load contacts are often referred to as emitter and collector.

Depending upon the particular implementation of the power transistor, the control signal may be at least one of a voltage signal or current signal, e.g., having an amplitude in the range of 100 mA-2 A. For example, the control signal may apply a defined electric potential to the control contacts of the power transistor, e.g., with respect to one of the load contacts.

Hereinafter, for sake of simplicity, various examples are described with respect to IGBT power transistors. Here, the control signal typically corresponds to a control current, as well as to an electric potential being applied to the base contact of the power transistor. However, similar techniques may be readily applied to, e.g., power FETs or bipolar power transistors.

In some examples, a circuit is described which is configured to provide one or more control signals. Typically, such a circuit is referred to as a drive circuit. In some examples, the drive circuit is integrated on a substrate, i.e., forms and integrated circuit (IC). Then, the drive IC may have terminals to communicate with the environment. The terminals may be formed by bond pads, contact plugs, etc. For sake of simplicity, hereinafter, reference is made to a drive IC; however, the examples may be readily applied to other circuit design techniques, e.g., including surface mounted elements.

For example, the drive IC may include an input terminal configured to receive an input signal. The input signal may be a logical signal, i.e., having a defined high signal level and a defined low signal level. In some examples, the input signal may be a complementary input signal: here, the input signal may include two components which alternatingly assume high signal level. It is possible that the complementary input signal includes dead times, i.e., a time duration between a first component and a second component assuming the high signal level during which both components are at low signal level (and vice versa).

For example, the drive IC may include one or more output terminals via which one or more control signals are output.

In some examples, the power transistors may be arranged in a half bridge architecture. Then, a half bridge drive IC is configured to provide a high-side control signal to a high-side power transistor and to further provide a low-side control signal to a low-side power transistor. The high-side power transistor and the low-side power transistor are arranged in series connection between the supply voltage and ground. The reference potential of the low-side power transistor is typically emitter potential or ground; while the reference potential of the high-side power transistor is typically the potential of the center point between the two power transistors, e.g., for bipolar transistors or IGBTs arranged at the emitter side of the high-side power transistor. Typically, the input signal received by the half bridge drive IC is a complementary input signal including a high-side component and the low-side component alternatingly the assuming the high signal level. Also, a bootstrapping architecture could be applied.

Hereinafter, various examples are described with respect to a half-bridge drive circuit including, both, a high side with a high-side driver and a low-side with a low-side driver. However, the various techniques may be readily applied to a universal power transistor driver that may be used to control a high-side power transistor and a low-side power transistor alike depending on the particular application. For example, various techniques described herein with respect to features of the high side may be applied to such a drive circuit. For example, various techniques described herein with respect to features of the low side may be applied to such a drive circuit. Here, two of such universal drivers may be combined to a half-bridge driver circuit. The various techniques described herein include examples which relate to the high side and the low side in a corresponding manner. The various techniques may be readily employed to a universal driver that may be used to drive the high side and the low side alike. Features of the high side may be applied in isolation to the universal drive circuit. Features of the low side may be applied in isolation to the universal drive circuit.

In some examples, the high-side of the half bridge drive IC and the low-side of the half bridge drive IC may be coupled via a capacitor. For this, in some examples the half bridge drive IC may include an interface configured to couple the high-side terminal and the low-side terminal via the capacitor. It is possible that the interface includes terminals: Here, it is possible that the capacitor does not form part of the IC; rather, the capacitor may be a discrete device, e.g., coupled with the IC via surface mounted technology.

By providing the capacitor, it is possible to tailor the switching duration of the power transistors. In particular, balancing signals received and transmitted by the capacitor can be used to modify the control signals. When switching on a power transistor, the capacitor may receive a balancing signal branched off from the respective control signal; thus, the slope of the control signal is reduced such that the switching duration of the respective power transistor is prolonged. Likewise, when switching off a power transistor, the capacitor may provide a balancing signal branched into the respective control signal; thus, the decrease in the control signal is delayed such that the switching duration of the respective power transistor is prolonged. In some examples, it is possible to tailor the switching duration by appropriately dimensioning the capacity of the capacitor.

FIG. 1 illustrates aspects with respect to a system 100 including a high-side IGBT power transistor 139 and a low-side IGBT power transistor 149 arranged in half bridge architecture. The power transistors 139, 149 have antiparallel diodes (free-wheeling diodes). The system 100 further includes a half bridge drive IC 101.

A supply voltage 91 is applied across the serial connection of the power transistors 139, 149. The collector terminal of the high-side IGBT power transistor 139 is connected to the positive potential DC+ of the supply voltage 91. The emitter terminal of the low-side IGBT power transistor 149 is connected to the reference potential PWGND of the supply voltage 91. While in FIG. 1 IGBT transistors are employed, other examples may employ bipolar transistors or FETs, etc.

A current 81 is provided to the collector terminal of power transistor 139 and a load current 82 is provided to the collector terminal of power transistor 149. The currents 81, 82 may flow between the load contacts of the power transistors 139, 149, if allowed by the control signal. The load currents 81, 82 correspond, in the example of FIG. 1, to collector-emitter currents. Currents 83, 84 are also illustrated in FIG. 1; these correspond to the control current. Depending on the electric potential 137 of the gate of the power transistor 139 with respect to the electric potential at the emitter of the power transistor 139 (high-side reference potential), i.e., depending on the gate-emitter voltage, the high-side power transistor 139 is conductive or non-conductive and supports varying load currents 81. Similar considerations apply with respect to the low-side power transistor 149. Here, the low-side reference potential is ground and a respective electric potential 147 is applied to the gate. An output voltage 92 is provided across the low-side power transistor 149; this results in a load current 85 being provided to the load.

The resistivity of the control resistors 139-1, 149-1 dimensions the switching duration of the power transistors 139, 149. Typically, the control resistors 139-1, 149-1 are not integrated with the half bridge drive IC 101, but are discrete devices.

In the various examples described herein, it is not required to provide the control resistors 139-1, 149-1. However, it is possible to provide the control resistors 139-1, 149-1 in some examples.

The half bridge drive IC 101 is configured to receive an input signal including a high-side component 251 and a low-side component 261. The high-side control current 83 is provided to the high-side power transistor 139 by the half bridge drive IC 101 based on the high-side component 251 of the input signal. The low-side control current 84 is provided to the low-side power transistor 149 by the half bridge drive IC 101 based on the low-side component 261 of the input signal.

Figure 2:
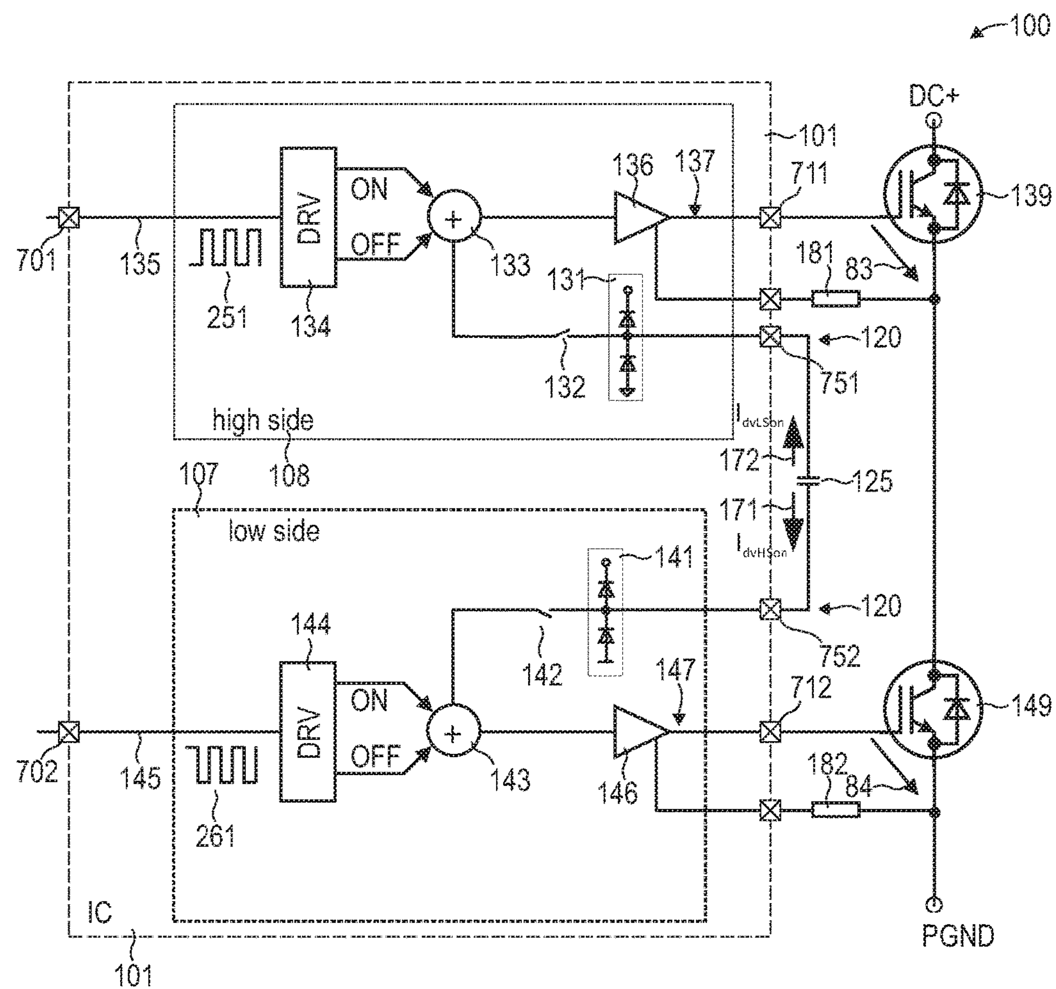
FIG. 2 is a circuit diagram illustrating the half bridge drive circuit of the system of FIG. 1 in greater detail, the half bridge drive circuit including an interface configured to couple the high side and the low side via a capacitor according to various embodiments.

FIG. 2 illustrates aspects with respect to a system 100 including a high-side power transistor 139 and a low-side power transistor 149 arranged in half bridge architecture. The system 100 further includes a half bridge drive IC 101 (dashed line in FIG. 2). FIG. 1 generally corresponds to FIG. 2. FIG. 2 further illustrates aspects with respect to the half bridge drive IC 101 in detail.

Illustrated in FIG. 2 is a high-side driver 134 of a high side 108 of the half bridge drive IC 101 and a low-side driver 144 of a low side 107 of the half bridge drive IC 101. The high-side driver 134 is configured to provide a high-side control current 83 to the high-side power transistor 139 via a high-side terminal 711 based on the high-side component 251 of the input signal. The high-side component 251 is received via a respective input terminal 701. The low-side driver 144 is configured to provide a low-side control current 84 to the low-side power transistor 149 via a low-side terminal 712 based on the low-side component 261 of the input signal. The low-side component 261 is received via a respective input terminal 702. The drivers 134, 144 also provide respective electric potentials 137, 147 at the terminals 711, 712.

Illustrated in FIG. 2 is, furthermore, an interface 120 between the high side 108 of the half bridge drive IC 101 and the low side 107 of the drive IC 101. The interface 120 enables to couple the high side 108 and the low side 107 of the half bridge drive IC 101. In particular, in the example of FIG. 2, the interface 120 enables to couple the high-side terminal 711 and the low-side terminal 712 via a capacitor 125. The capacitor is a discrete device not part of the drive IC 101 and is contacted via terminals 751, 752.

Such coupling via the interface 120 and the capacitor 125 supports balancing currents 171, 172. The balancing currents 171, 172 may have significant AC-components, because they originate from the switching process during which a time derivative of the control currents 83, 84 is significant. The balancing currents 171, 172 may charge and discharge the capacitor 125 and/or may flow across the capacitor 125.

In FIG. 2, the balancing current 171 flowing from the high-side 108 and through the capacitor 125 to the low side 107 during a switching process corresponding to activation of the high-side power transistor 139 is illustrated; a respective balancing current flowing from the capacitor 125 to the high-side 108 during a switching process corresponding to the deactivation of the high-side power transistor 139 is not illustrated. Likewise, in FIG. 2, the balancing current 172 flowing from the low side 107 through the capacitor 125 and to the high side 108 during a switching process corresponding to activation of the low-side power transistor 149 is illustrated; a respective balancing current flowing from the capacitor 125 to the low side 107 during a switching process corresponding to the deactivation of the low-side power transistor 149 is not illustrated.

The balancing currents 171, 172 may be branched off from/branched into the control currents 83, 84. Thereby, the instantaneous amplitude of the control currents 83, 84 during the switching process is reduced. This results in a longer switching duration of the power transistors 139, 149.

For example, such a change of the instantaneous amplitude may be achieved by using the balancing currents 171, 172 as control for adjusting the rate of change of the electric potential at the terminals 711, 712. This may be implemented using a push-pull architectures controlled using the balancing currents 171, 172 (not shown in FIG. 2).

In FIG. 2, the half bridge drive IC 101 further includes a high-side link 133 coupled with the interface 120 and the high-side terminal 711 and configured to modify the high-side control current 83 provided by the high-side terminal 711 based on the balancing current 171 provided by the interface 120. Furthermore, in FIG. 2, the half bridge drive IC 101 includes a low-side link 143 coupled with the interface 120 and the low-side terminal 712 and configured to modify the low-side control current 84 provided by the low-side terminal 712 based on the balancing current 172 provided by the interface 120.

The links 133, 143 may, alternatively or additionally, modify the respective electric potentials 137, 147 based on the balancing signals 171, 172 provided by the interface 120.

In FIG. 2, an example implementation of the high-side link 133 and the low-side link 143 as an adder, respectively, is illustrated. In other examples, other implementations of the high-side link 133 and/or the low-side link can be used.

The half bridge drive IC 101 further includes a high-side amplifier 136 arranged between the high-side link 133 and the high-side terminal 711. The high-side amplifier 136 is configured to amplify the modified high-side control current 83.

By amplifying the high-side control current 83 downstream of the high-side driver 134 and downstream of the high-side link 133 enables to implement the corresponding logic using low voltages and low currents. This facilitates high integration of the corresponding logic. Further, energy consumption is limited.

For example, the high-side amplifier 136 can be configured to amplify the high-side control current 83 with a given gain. The gain may be predefined. In other examples, the high-side amplifier 136 may optionally include a control terminal; a control signal received via the control terminal may configure the gain. In the example of FIG. 2, an implementation is shown where a control terminal of the high-side amplifier 136 is coupled with the high-side reference potential present at the emitter of the power transistor 139 via a high-side control resistor 181. The resistivity of the resistor 181 defines the gain of the amplifier 136.

The variable gain, in turn, can be used in order to tailor the switching duration: In particular, by appropriately dimensioning the high-side control current 83 as provided by the driver 134 with respect to the balancing current 171 and the gain, reaching of the threshold current by the control current 83 can be accelerated or delayed.

In the example of FIG. 2, the high-side control resistor 181 is not integrated on the same substrate as the half bridge drive IC 101; rather, the resistor 181 is implemented as a discrete device, e.g., attached to the substrate in a surface mounted technology. Thereby, it is possible to simply exchange the resistor 181 between different devices of a manufacturing batch—thereby tailoring the respective resistivity and, in turn, the switching duration.

Above, various aspects have been described with respect to the high-side amplifier 136 and the high-side control resistor 181. Similar aspects may apply directly to a respective low-side amplifier 146 and a respective low-side control resistor 182.

In the example of FIG. 2, the capacitor 125 of the system 100 is not integrated on the same substrate as the half bridge drive IC 101; rather, the capacitor 125 is implemented as a discrete device, e.g., attached to the substrate. Thereby, it is possible to simply exchange the capacitor 125 between different devices of a manufacturing batch—thereby tailoring the respective capacity and, in turn, the balancing currents 171, 172 and, thus, the switching duration.

Furthermore, by implementing the capacitor 125 as a discrete device, it is possible to use comparably large capacitances. For example, the capacitor 125 may have a capacitance of at least 10 pF, optionally of at least 50 pF, further optionally of at least 100 pF. The capacitor 125 may be a high-voltage capacitor 125. By correspondingly dimensioning the capacitance of the capacitor 125, it is possible to tailor the switching duration by a significant amount.

In the example of FIG. 2, the interface 120 further includes a high-side switch 132 which is associated with a high-side link 133. In particular, the high-side switch 132 is arranged adjacent to the link 133. The interface 120 further includes a low-side switch 142 which is associated with the low-side link 143. In particular, the low-side switch 142 is arranged adjacent to the link 143.

By using the switches 132, 142, it is possible to re-use the same capacitor 125 for modifying, both, the high-side control current 83, as well as the low-side control current 84. This enables higher integration; further, the number of elements and, thus, complexity is reduced.

The high-side switch 132 is arranged between the high-side link 133 and the capacitor 125 and is configured to selectively forward the balancing current 171 between the high-side link 133 and the capacitor depending on the activated switch position of the high-side switch 132: in the particular example of FIG. 2, the activated switch position in which the balancing current 171 is forwarded corresponds to a conductive state of the switch 132. Generally, it would also be possible—depending on the arrangement of the switch 132—that the non-conductive state corresponds to forwarding the balancing current 171. For sake of simplicity, hereinafter, the modification position of the switch 132 shall refer to the switch position in which the balancing current 171 is forwarded to thus modify the respective control current 83, 84 and the non-modification position of the switch 132 corresponds shall refer to the switch position in which the balancing signal 171 is not forewarded and, thus, the control current is not modified.

Likewise, the low-side switch 142 is arranged between the low-side link 143 and the capacitor 125 and is configured to selectively forward the balancing current 172 between the low-side link 143 and the capacitor 125 depending on the activated switch position of the low-side switch 142. The low-side switch 142 is configured to forward (not forward) the balancing current 172 in the modification position (non-modification position).

By alternatingly operating the switches 132, 142, it is possible to avoid unintentional switching of the power transistors 139, 149. In particular, during a switching process of the high-side power transistor 139, the non-modification position of the low-side switch 142 may be activated: thereby, propagation of the respective balancing current 171 towards the low-side link 143 is avoided. This prevents unintentional switching of the low-side power transistor 149. Likewise, during a switching process of the low-side power transistor 149, the non-modification position of the high-sides which 132 may be activated: thereby, propagation of the respective balancing current 172 towards the high-side link 142 is avoided. This prevents unintentional switching of the high-side power transistor 139.

Thus, as will be appreciated from the above, the half bridge drive IC 101 is configured to selectively modify the high-side control current 83 based on the balancing current 171 depending on the activated switch position of the high-side switch 132. Likewise, the half bridge drive IC 101 is configured to selectively modify the low-side control current 84 based on the balancing current 172 depending on the activated switch position of the low-side switch 142.

To support the balancing currents 171, 172, a high-side clamp 131 and the low-side clamp 141 is provided. The clamps 131, 141 can absorb the charges associated with the balancing currents 171, 172. The clamps 131, 141 are optional. While in FIG. 2 the clamps 131, 141 are shown as being implemented based on diodes, other kinds and types of clamping circuits may be used.

For appropriate operation of the switches 132, 142, a control logic may be provided (not shown in FIG. 2). For example, the control logic may be a microcontroller or a processor or application-specific IC (ASIC). The control logic may be integrated with the half bridge drive IC 101.

The control logic may be coupled with the input terminals 701, 702 and may be configured to activate different switch positions of the switches 132, 142, respectively, based on the input signal 251, 261.

For example, in response to the high-side component 251 of the input signal transitioning from low to high signal level, the control logic may activate the non-modification position of the low-side switch 142 and may activate the modification position of the high-side switch 132. For example, in response to the high-side component 251 of the input signal transitioning from high to low signal level, the control logic may de-activate the modification position of the high-side switch 132, possibly with some latency.

For example, in response to the low-side component 261 of the input signal transitioning from low to high signal level, the control logic may activate the modification position of the low-side switch 142 and may activate the non-modification position of the high-side switch 132. For example, in response to the low-side component 261 of the input signal transitioning from high to low, the control logic may de-activate the modification position of the low-side switch 142, possibly with some latency.

In some examples, it is possible that the control logic is further coupled with the terminals 711, 712 and is configured to activate different switch positions of the switches 132, 142, respectively, based on the corresponding drive currents 83, 84 and/or based on the electric potentials 137, 147. In such a scenario, it is possible to introduce some latency after a transition of the corresponding component 251, 261 of the input signal from high to low signal: thereby, it is possible to account for the finite switching duration when switching off the power transistors 139, 149, i.e., in a state where the respective component 251, 261 of the input signal is already at low signal level, but the respective power transistor 139, 149 is still conductive. During the switching duration, modification of the respective control current 83, 84 based on the corresponding balancing current 171, 172 remains possible if the respective switch 132, 142 is maintained in the modification position for some time. This allows tailoring the switching duration for the switching process corresponding to switching off the power transistors 139, 149. In particular, the time-domain decrease of the respective control current 83, 84 can be reduced.

Figure 3:
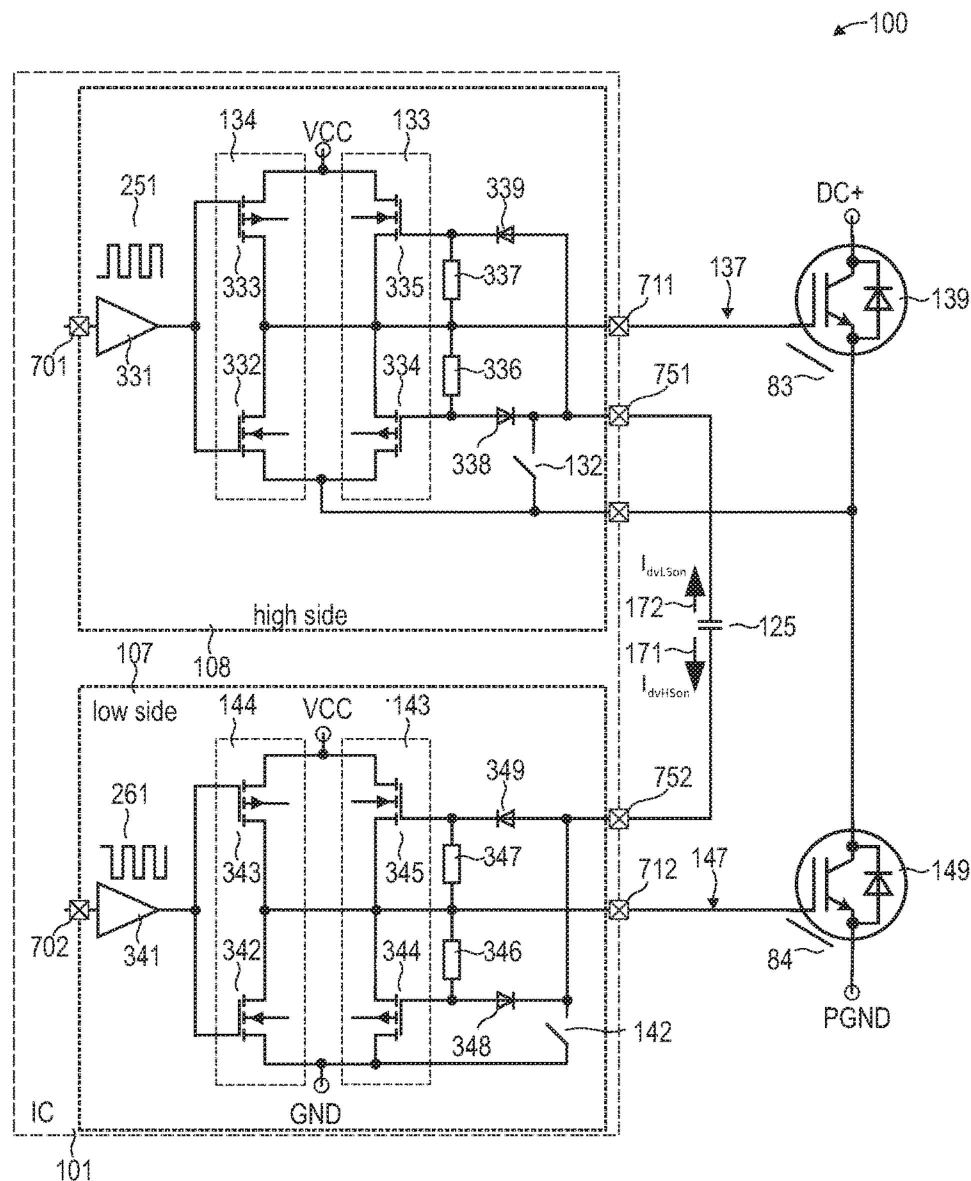
FIG. 3 is a circuit diagram illustrating the half bridge drive circuit of the system of FIG. 1 in greater detail, the half bridge drive circuit including an interface configured to couple the high side and the low side via a capacitor according to various embodiments.

FIG. 3 illustrates aspects with respect to a system 100 including a high-side power transistor 139 and a low-side power transistor 149 arranged in half bridge architecture. The system 100 further includes a half bridge drive IC 101 (dashed line in FIG. 3). FIG. 3 generally corresponds to FIG. 1. FIG. 3 further illustrates aspects with respect to the half bridge drive IC 101 in detail.

In the example of FIG. 3, the amplifiers 331, 341 provide the input signal.

In the example of FIG. 3, the high-side driver 134 is implemented in a push-pull architecture. Here, the high-side driver 134 includes a high-side pull-up P-channel transistor 333 and the high-side pull-down N-channel transistor 332. Both transistors 332, 333 are being switched depending on the high-side component 251 of the input signal. It is possible that an activation delay is provided for the transistors 332, 333 (not shown in FIG. 3) to avoid a short circuit. The reference potential of the high-side driver 134 is set to the potential at the emitter-side of the high-side power transistor 139. In other examples, it would be possible that the reference potential of the high-side driver is set to a defined negative electric potential with respect to the potential at the emitter-side of the high-side power transistor 139.

The low-side driver 144 is configured correspondingly: the low-side driver 144 includes a low-side pull-up P-channel transistor 343 and low-side pull-down N-channel transistor 142, both being switched depending on the low-side component 261 of the input signal. It is possible that an activation delay is provided for the transistors 342, 343 (not shown in FIG. 3) to avoid a short circuit. The reference potential of the low-side driver 144 is ground. In other examples, it would be possible that the reference potential of the low-side driver is set to a defined negative electric potential with respect to the potential at the emitter-side of the low-side power transistor 149.

FIG. 3 further illustrates details of the links 133, 143. Also the links 133, 143 are implemented in push-pull architecture. However, the push-pull architecture of the links 133, 143 is inverted if compared to the push-pull architecture of the drivers 134, 144: this enables to counteract changes of the control currents 83, 84 and the electric potentials 137, 147 as a function of time.

In detail, the high-side link 133 includes a high-side pull-up N-channel transistor 335 and a high-side pull-down P-channel transistor 334, both being switched based on the balancing signal 171. Likewise, the low-side link 134 includes a low-side pull-up N-channel transistor 345 and a low-side pull-down P-channel transistor 434, both being switched based on the balancing signal 172.

The functionality of the high-side link 133 will be explained, hereinafter. In particular, the functionality of the high-side link 133 will be explained with respect to the transition the high-side component 251 of the input signal from low signal level to high signal level. This functionality may serve as an example for the respective functionality of the high-side link 133 with respect to the transition of the high-side component 251 of the input signal from high signal level to low signal level, as well as an example for the respective functionality of the low-side link 143 with respect to the transition of the low-side component 261 of the input signal from high signal level to low signal level and vice versa.

If the component 251 of the input signal is still at low signal level, the N-channel transistor 332 pulls down the electric potential 137 at the terminal 711 to the reference potential of the high side 108.

In response to the component 251 of the input signal transitioning from low signal level to high signal level, the N-channel transistor 332 switches to non-conductive and the P-channel transistor 333 switches to conductive: the electric potential 137 at the terminal 711 is then pulled up to the supply voltage potential of the high side 108. A fraction of the resulting control current 83 towards the terminal 711 is branched off via the resistor 336 and the diode 338 towards the interface 120 and, in particular, the capacitor 125. This is the balancing current 711.

As a result, also the control contact of the P-channel pull-down transistor 334 is pulled up and is switched to conductive state. Then, the raise in the potential 137 at the terminal 711 is counteracted.

Because the high-side component 251 of the input signal already transitioned to high signal level (as explained above), the high-side switch 132 has the modification position activated: in the example of FIG. 3, the modification position corresponds to the high-side switch 132 being non-conductive. This is because the high-side switch selectively couples the interface 120 with the high-side reference potential depending on the activated switch position of the high-side switch 132. Because the high-side switch 132 is nonconductive, the respective balancing current 171 cannot flow towards to reference potential of the high side 108, but is forced towards the interface 120 with the capacitor 125.

If the high-side component 251 of the input signal is at high signal level, the low-side component 261 of the input signal is at low signal level. Because the low-side component 261 of the input signal is a low signal level, the low-side switch 142 is in the non-modification position. The non-modification position corresponds to the low-side switch 142 being conductive. Therefore, the balancing current 171 received from the high side 108 is forwarded towards the reference potential/ground of the low side 107. In particular, the balancing current 171 does not change the low-side control current 84, but is rather absorbed by ground.

Figure 4:
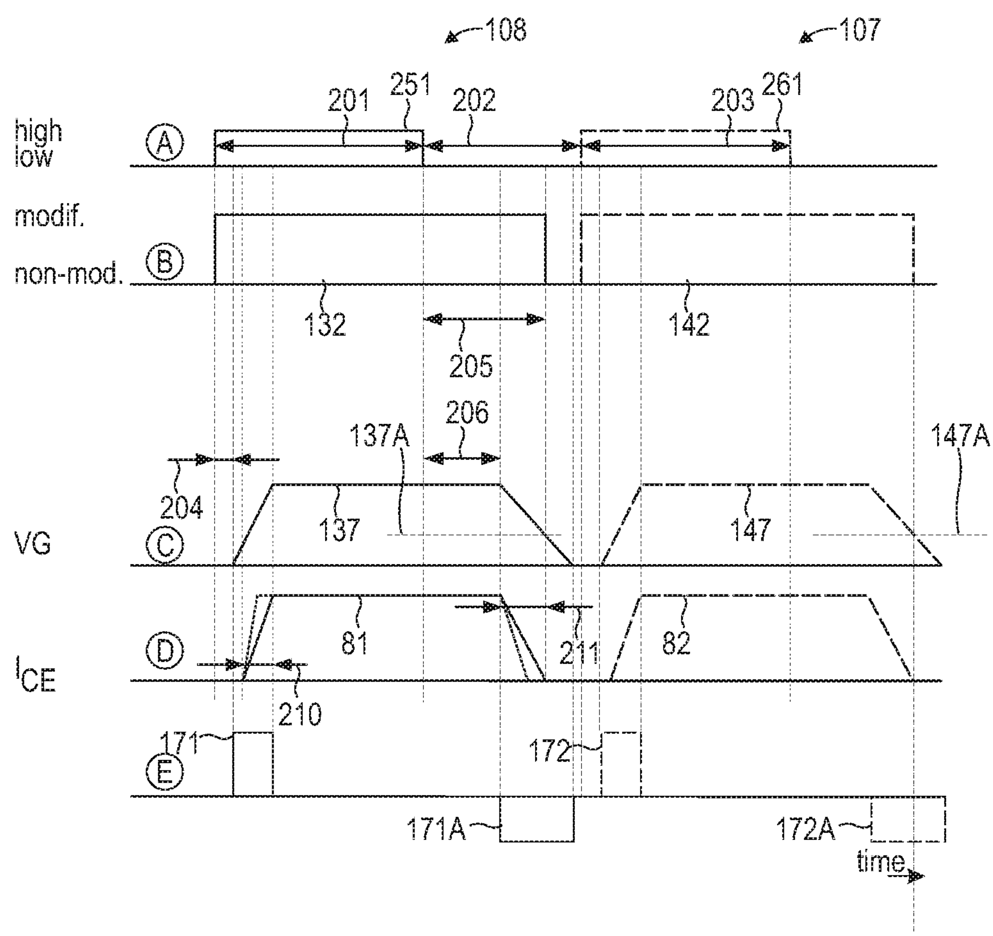
FIG. 4 schematically illustrates the time evolution of a logical input signal to the half bridge drive circuit, the load current through the power transistors, and a balancing current through the interface according to various embodiments.

FIG. 4 illustrates the time evolution of various signal levels. FIG. 4, in detail, illustrates the time evolution of the high-side component 251 of the input signal (full line) and the time evolution of the low-side component 261 of the input signal (dashed line) in row A. During the on-time 201 of the component 251, the component 251 assumes the high signal level and the component 261 assumes the low signal level. During the on-time 203 of the component 261, the component 251 assumes the low signal level and the component 261 assumes the high signal level. A dead time 202 is provisioned during which, both, the component 251, as well as the component 261 assume the low signal level.

FIG. 4 further illustrates the time evolution of the switch position of the high-side switch 132 (full line) and the time evolution of the low-side switch 142 (dashed line) in row B. The modification switch position of the high-side switch 132 is activated if the high-side component 251 is high. The non-modification switch position of the high-side switch 132 is activated if the high-side component 251 is low and if the electric potential 137 at the high-side terminal 711 is below a threshold 137A. The modification switch position of the low-side switch 142 is activated if the low-side component 261 is high. The non-modification switch position of the low-side switch 142 is activated if the low-side component 261 is low and if the electric potential 147 at the low-side terminal 712 is below a threshold 147A.

FIG. 4 further illustrates the time evolution of the electric potential 137 at the high-side terminal 711, i.e., the control contact of the high-side power transistor and the time evolution of the electric potential 147 of at the low-side terminal 712, i.e., the control contact of the low-side power transistor, in row C.

After the high-side component 251 of the input signal transitions from low to high, for a certain time duration 204 the electric potential 137 does not increase. This may be due to a delay provisioned in the high-side driver 134 to avoid a short circuit of the push-pull architecture 332, 333 and/or due to a finite switching duration of the pull-up transistor 333 or the respective control logic.

Then, the electric potential 137 increases. This results in an increase of the load current 81 (row D of FIG. 4). The switching duration 210 when switching the power transistor 139 to conductive state is illustrated.

In the example of FIG. 4, the switching duration 210 is comparably long. This is achieved by means of the balancing current 171 (row E of FIG. 4). The balancing current 171 is used to control the link 133. The pull-down transistor 334 of the link 133 is switched to conductive state by the balancing current 171. Then, the rate of change of the electric potential 137 is lowered and, thus, also the rate of change of the load current 81 is reduced. FIG. 4 further schematically illustrates the collector-emitter voltages of the power transistors 139, 149 (row F of FIG. 4). As illustrated in FIG. 4, the collector-emitter voltages correlate with the balancing currents 171, 171A, 172, 172A.

The switching duration 210 may further depend on the resistivity of the resistor 336. The switching duration 210 may depend on the capacity of the capacitor 125.

In FIG. 4, a rapid increase of the load current 81 according to reference implementations is illustrated (dotted line) for comparison.

FIG. 4 illustrates a scenario for an inductive load. The rising edge of the load current 81 shows a shoot-over due to the reverse-recovery properties of the free-wheeling diodes of the power transistors 139, 149.

In response to the high-side component 251 transitioning to low signal level, the high-side switch 132 initially remains in the modification position for a duration 205. This is because the modification position is activated for the high-side switch 132 as long as the electric potential 137 does not fall below the threshold 137A. This facilitates slow-down of the deactivation of the high-side power transistor 139.

After the component 251 transitions from high to low, for a certain time duration 206 the electric potential 137 does not decrease. This may be due to a delay provisioned in the driver 134 to avoid a short circuit of the push-pull architecture 332, 333 and/or due to a finite switching duration of the pull-down transistor 332 or the respective control logic and/or due to a finite switching delay of the power transistor.

Then, with decreasing electric potential 137, the load current 81 is reduced to zero within a switching duration 211. Again, the shorter switching duration according to reference implementations is illustrated in FIG. 4 (dotted line).

The respective balancing current 171A is provided by the capacitor 125 via diode 339 and resistor 337 (cf. FIG. 3). This activates the N-channel transistor 335 of the link 133. Thus, the decrease of the electric potential at the terminal 711 is counteracted.

Similar considerations as explained above with respect to the high side 108 also apply to the low side 107 switching process (dashed lines in FIG. 4); here the respective balancing currents 172, 172A are illustrated.

Figure 5:
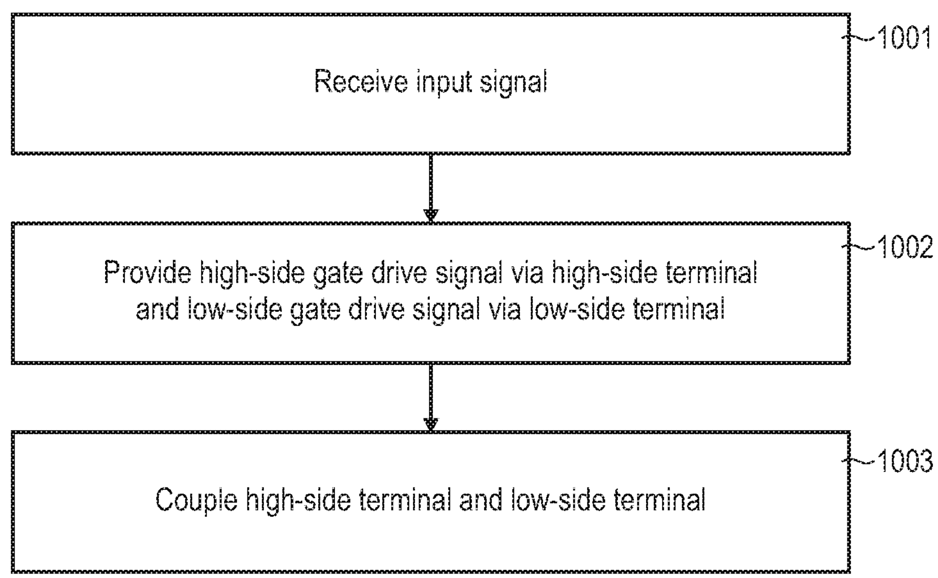
FIG. 5 is a flowchart of a method according to various embodiments.

FIG. 5 is a flowchart of a method according to various examples. At 1001, the input signal is received. For example, the input signal may include a high-side component and a low-side component, e.g., forming a complementary input signal.

At 1002, the high-side control signal is provided via the high-side terminal and the low-side control signal is provided via the low-side terminal. For example, for this, push-pull drivers can be employed: well-defined electric potential and/or drive currents are provided.

At 1003, the low-side terminal and the high-side terminal are coupled with each other, e.g., via the interface including the capacitor. Then, modification of the control signals based on balancing signals supported by the capacitor may be implemented in order to increase the switching duration of the associated high-side power transistor and the low-side power transistor.

Summarizing, above techniques have been described which enable to couple the rate of change of the control signals of power transistors of a half bridge arrangement with each other. A high-voltage capacitor may couple the low side domain and the high side domain with each other and may support a respective balancing circuit, the balancing circuit being characteristic with respect to a switching process of the high-side power transistor or the low-side power transistor. The balancing current can be directly dependent on the rate of change of the respective control current.

Such techniques enable to implement a single capacitor to measure and/or control the rate of change of the control signals of both power transistors of the half bridge architecture. Based on the balancing current, the control signals can be modified to change the switching duration of the power transistors during a switching process.

By such techniques, various effects may be achieved. For example, it is possible to use one and the same capacitor to control the switching duration of both power transistors of a half bridge architecture. Further, one and the same capacitor can be used to control the switching duration of, both, switching processes relating to a transition of the power transistors from non-conductive to conductive (activation), as well as switching processes relating to a transition of the power transistors from conductive to non-conductive (deactivation). According to the techniques described herein, a simple design of the respective circuit can be achieved. The control of the rate of change of the potential at the control contact enables high efficiency for various applications.

Although the invention has been shown and described with respect to certain preferred embodiments, equivalents and modifications will occur to others skilled in the art upon the reading and understanding of the specification. The present invention includes all such equivalents and modifications and is limited only by the scope of the appended claims.

For example, while above various examples have been described with respect to IGBT power transistors, in other examples similar techniques may be readily applied for FETs or bipolar transistors.

For example, while above various examples have been described where the control current of the power transistors is used to control the rate of change of the electric potential at the control contact, in other scenarios, it is also conceivable to use the electric potential at the control contact to control the rate of change electric potential at the control contact. This may require current-to-voltage transformation.

For example, while above various examples have been described with respect to a half bridge driver IC, such techniques may be readily applied to a universal driver IC that may be used to drive a low side and a high side power transistor alike depending on the application. E.g., two such a universal driver IC may be combined to form a half bridge driver IC. The universal driver IC may include the features of the high side or the low side, as described herein. Summarizing, at least the following examples have been described:

Example 1

A circuit, comprising:

an input terminal configured to receive an input signal, a high-side driver configured to provide a high-side control signal to a high-side power transistor via a high-side terminal based on the input signal, a low-side driver configured to provide a low-side control signal to a low-side power transistor via a low-side terminal based on the input signal, and an interface configured to couple the high-side terminal and the low-side terminal via a capacitor.

Example 2

The circuit of example 1, further comprising:

a high-side link coupled with the interface and the high-side terminal and configured to modify the high-side control signal provided by the high-side terminal based on a balancing signal provided by the interface, and a low-side link coupled with the interface and the low-side terminal and configured to modify the low-side control signal provided by the low-side terminal based on the balancing signal provided by the interface.

Example 3

The circuit of example 2, further comprising:

a high-side amplifier arranged between the high-side link and the high-side terminal and configured to amplify the high-side control signal, and a low-side amplifier arranged between the low-side link and the low-side terminal and configured to amplify the low-side control signal.

Example 4

The circuit of example 3, further comprising:

a high-side gain interface configured to couple a control terminal of the high-side amplifier with a high-side reference potential via a high-side control resistor, and a low-side gain interface configured to couple a control terminal of the low-side amplifier with a low-side reference potential via a low-side control resistor.

Example 5

The circuit of any one of examples 2-4, wherein the high-side link comprises a high-side pull-up N-channel transistor and a high-side pull-down P-channel transistor both being switched depending on the balancing signal, wherein the low-side link comprises a low-side pull-up N-channel transistor and a low-side pull-down P-channel transistor both being switched depending on the balancing signal.

Example 6

The circuit of any one of the preceding examples, wherein the high-side driver comprises a high-side pull-up P-channel transistor and a high-side pull-down N-channel transistor both being switched depending on a high-side component of the input signal, wherein the low-side driver comprises a low-side pull-up P-channel transistor and a low-side pull-down N-channel transistor both being switched depending on a low-side component of the input signal.

Example 7

The circuit of example 2, further comprising:

a high-side switch of the interface associated with the high-side link, and a low-side switch of the interface associated with the low-side link.

Example 8

The circuit of example 7, wherein the circuit is configured to selectively modify the high-side control signal based on the balancing signal depending on an activated switch position of the high-side switch, wherein the circuit is configured to selectively modify the low-side control signal based on the balancing signal depending on activated switch position of the low-side switch.

Example 9

The circuit of examples 7 or 8, wherein the high-side switch is arranged between the high-side link and the capacitor and configured to selectively forward the balancing signal between the high-side link and the capacitor depending on an activated switch position of the high-side switch, wherein the low-side switch is arranged between the low-side link and the capacitor and configured to selectively forward the balancing signal between the low-side link and the capacitor depending on an activated switch position of the low-side switch.

Example 10

The circuit of any one of examples 7-9, further comprising:

at least one control logic coupled with the input terminal and configured to activate different switch positions of the high-side switch and the low-side switch, respectively, based on the input signal.

Example 11

The circuit of example 10, wherein the at least one control logic is further coupled with the high-side terminal and the low-side terminal and configured to activate different switch positions of the high-side switch and the low-side switch, respectively, based on the high-side control signal and the low-side control signal.

Example 12

The circuit of example 11, wherein the at least one control logic is configured to activate a first switch position of the high-side switch if a high-side component of the input signal is high and to activate a second switch position of the high-side switch if the high-side component of the input signal is low and if the high-side control signal is below a threshold, wherein the at least one control logic is configured to activate a first switch position of the low-side switch if a low-side component of the input signal is high and to activate a second switch position of the low-side switch if the low-side component of the input signal is low and if the low-side control signal is below the threshold.

Example 13

The circuit of example 12, wherein the circuit is configured to modify the high-side control signal based on the balancing signal if the first switch position of the high-side switch is activated and configured to not modify the high-side control signal based on the balancing signal if the second switch position of the high-side switch is activated, wherein the circuit is configured to modify the low-side control signal based on the balancing signal if the first switch position of the low-side switch is activated and configured to not modify the low-side control signal based on the balancing signal if the second switch position of the low-side switch is activated.

Example 14

The circuit of any one of examples 7-13, wherein the high-side switch selectively couples the interface with a high-side reference potential depending on an activated switch position of the high-side switch, wherein the low-side switch selectively couples the interface with a low-side reference potential depending on an activated switch position of the low-side switch.

Example 15

The circuit of any one of examples 7-14, further comprising:

a high-side clamp arranged in-between the high-side switch and the interface, a low-side clamp arranged in-between the low-side switch and the interface.

Example 16

The circuit of any one of the preceding examples, wherein the circuit is integrated on a substrate, wherein the interface is configured to couple to the capacitor implemented as a discrete device.

Example 17

A system, comprising:

the circuit of any one of the preceding examples, and the capacitor coupled with the interface, wherein the capacitor has a capacitance of at least 10 pF, optionally of at least 50 pF, further optionally of at least 100 pF.

Example 18

The system of example 17, further comprising:

the high-side power transistor, and the low-side power transistor, wherein the high-side power transistor and the low-side power transistor are arranged in a half bridge architecture.

Example 19

A circuit, comprising:

an input terminal configured to receive an input signal, a high-side driver configured to provide a high-side control signal to a high-side power transistor via a high-side terminal based on the input signal, and an interface configured to couple, via a capacitor, the high-side terminal with a low-side terminal which can provide a low-side control signal to a low-side power transistor from a low-side driver.

Example 20

A method, comprising:

receiving an input signal, providing a high-side control signal to a high-side power transistor via a high-side terminal and based on the input signal, providing a low-side control signal to a low-side power transistor via a low-side terminal and based on the input signal, coupling the high side terminal and the low-side terminal via a capacitor.

What is claimed is:

1. A circuit, comprising:

an input terminal configured to receive an input signal, a high-side driver configured to provide a high-side control signal to a high-side power transistor via a high-side terminal based on the input signal, a low-side driver configured to provide a low-side control signal to a low-side power transistor via a low-side terminal based on the input signal, and an interface configured to couple the high-side terminal and the low-side terminal via a capacitor and configured to branch off a signal from the high-side control signal or the low-side control signal to the capacitor, a high-side link coupled with the interface and the high-side terminal and configured to modify the high-side control signal provided by the high-side terminal based on a balancing signal provided by the interface, and a low-side link coupled with the interface and the low-side terminal and configured to modify the low-side control signal provided by the low-side terminal based on the balancing signal provided by the interface.

2. The circuit of claim 1, further comprising:

a high-side amplifier arranged between the high-side link and the high-side terminal and configured to amplify the high-side control signal, and a low-side amplifier arranged between the low-side link and the low-side terminal and configured to amplify the low-side control signal.

3. The circuit of claim 2, further comprising:

a high-side gain interface configured to couple a control terminal of the high-side amplifier with a high-side reference potential via a high-side control resistor, and a low-side gain interface configured to couple a control terminal of the low-side amplifier with a low-side reference potential via a low-side control resistor.

4. The circuit of claim 1, wherein the high-side link comprises a high-side pull-up N-channel transistor and a high-side pull-down P-channel transistor both being switched depending on the balancing signal, wherein the low-side link comprises a low-side pull-up N-channel transistor and a low-side pull-down P-channel transistor both being switched depending on the balancing signal.

5. The circuit of claim 1, wherein the high-side driver comprises a high-side pull-up P-channel transistor and a high-side pull-down N-channel transistor both being switched depending on a high-side component of the input signal, wherein the low-side driver comprises a low-side pull-up P-channel transistor and a low-side pull-down N-channel transistor both being switched depending on a low-side component of the input signal.

6. The circuit of claim 1, further comprising:

a high-side switch of the interface associated with the high-side link, and a low-side switch of the interface associated with the low-side link.

7. The circuit of claim 6, wherein the circuit is configured to selectively modify the high-side control signal based on the balancing signal depending on an activated switch position of the high-side switch, wherein the circuit is configured to selectively modify the low-side control signal based on the balancing signal depending on an activated switch position of the low-side switch.

8. The circuit of claim 6, wherein the high-side switch is arranged between the high-side link and the capacitor and configured to selectively forward the balancing signal between the high-side link and the capacitor depending on an activated switch position of the high-side switch, wherein the low-side switch is arranged between the low-side link and the capacitor and configured to selectively forward the balancing signal between the low-side link and the capacitor depending on an activated switch position of the low-side switch.

9. The circuit of claim 6, further comprising:

at least one control logic coupled with the input terminal and configured to activate different switch positions of the high-side switch and the low-side switch, respectively, based on the input signal.

10. The circuit of claim 9, wherein the at least one control logic is further coupled with the high-side terminal and the low-side terminal and configured to activate different switch positions of the high-side switch and the low-side switch, respectively, based on the high-side control signal and the low-side control signal.

11. The circuit of claim 10, wherein the at least one control logic is configured to activate a first switch position of the high-side switch if a high-side component of the input signal is high and to activate a second switch position of the high-side switch if the high-side component of the input signal is low and if the high-side control signal is below a threshold, wherein the at least one control logic is configured to activate a first switch position of the low-side switch if a low-side component of the input signal is high and to activate a second switch position of the low-side switch if the low-side component of the input signal is low and if the low-side control signal is below the threshold.

12. The circuit of claim 11, wherein the circuit is configured to modify the high-side control signal based on the balancing signal if the first switch position of the high-side switch is activated and configured to not modify the high-side control signal based on the balancing signal if the second switch position of the high-side switch is activated, wherein the circuit is configured to modify the low-side control signal based on the balancing signal if the first switch position of the low-side switch is activated and configured to not modify the low-side control signal based on the balancing signal if the second switch position of the low-side switch is activated.

13. The circuit of claim 6, wherein the high-side switch selectively couples the interface with a high-side reference potential depending on an activated switch position of the high-side switch, wherein the low-side switch selectively couples the interface with a low-side reference potential depending on an activated switch position of the low-side switch.

14. The circuit of claim 6, further comprising:

a high-side clamp arranged in-between the high-side switch and the interface, a low-side clamp arranged in-between the low-side switch and the interface.

15. The circuit of claim 1, wherein the circuit is integrated on a substrate, wherein the interface is configured to couple to the capacitor implemented as a discrete device.

16. A system, comprising:

the circuit of claim 1, and the capacitor coupled with the interface, wherein the capacitor has a capacitance of at least 10 pF, optionally of at least 50 pF, further optionally of at least 100 pF.

17. The system of claim 16, further comprising:

the high-side power transistor, and the low-side power transistor, wherein the high-side power transistor and the low-side power transistor are arranged in a half bridge architecture.

18. A circuit, comprising:

an input terminal configured to receive an input signal, a high-side driver configured to provide a high-side control signal to a high-side power transistor via a high-side terminal based on the input signal, and an interface configured to couple, via a capacitor, the high-side terminal with a low-side terminal which can provide a low-side control signal to a low-side power transistor from a low-side driver and further configured to branch off a signal from the high-side control signal to the capacitor, wherein the input signal comprises a high-side component and a low-side component, wherein the input terminal comprises a high side input terminal coupled to an input of the high-side driver, the high-side input terminal configured to receive the high-side component of the input signal, and wherein the input terminal further comprises a low-side input terminal coupled to an input of the low-side driver, the low-side input terminal configured to receive the low-side component of the input signal.

19. A method, comprising:

receiving an input signal at an input terminal, using a high-side driver, providing a high-side control signal to a high-side power transistor via a high-side terminal and based on the input signal, using a low-side driver, providing a low-side control signal to a low-side power transistor via a low-side terminal and based on the input signal, coupling the high-side terminal and the low-side terminal via a capacitor, and branching off a signal from the high-side control signal or the low-side control signal to the capacitor, wherein the input signal comprises a high-side component and a low-side component, wherein the input terminal comprises a high side input terminal coupled to an input of the high-side driver, the high-side input terminal configured to receive the high-side component of the input signal, and wherein the input terminal further comprises a low-side input terminal coupled to an input of the low-side driver, the low-side input terminal configured to receive the low-side component of the input signal.

20. A circuit, comprising:

an input terminal configured to receive an input signal, a high-side driver configured to provide a high-side control signal to a high-side power transistor via a high-side terminal based on the input signal, a low-side driver configured to provide a low-side control signal to a low-side power transistor via a low-side terminal based on the input signal, and an interface configured to couple the high-side terminal and the low-side terminal via a capacitor and configured to branch off a signal from the high-side control signal or the low-side control signal to the capacitor, wherein the input signal comprises a high-side component and a low-side component, wherein the input terminal comprises a high side input terminal coupled to an input of the high-side driver, the high-side input terminal configured to receive the high-side component of the input signal, and wherein the input terminal further comprises a low-side input terminal coupled to an input of the low-side driver, the low-side input terminal configured to receive the low-side component of the input signal.

21. The circuit of claim 1, wherein the interface is configured to directly couple the high-side terminal and the low-side terminal via the capacitor.

* * * * *